United States Patent [19]
Calligaro et al.

[11] Patent Number: 5,694,363
[45] Date of Patent: Dec. 2, 1997

[54] READING CIRCUIT FOR MEMORY CELL DEVICES HAVING A LOW SUPPLY VOLTAGE

[75] Inventors: Cristiano Calligaro, Torre D'Isola; Roberto Gastaldi, Agrate Brianza; Nicola Telecco, Monreale; Guido Torelli, S. Alessio Con Vialone, all of Italy

[73] Assignee: SGS-Thomson Microelectronics S.r.l., Agrate Brianza, Italy

[21] Appl. No.: 638,976

[22] Filed: Apr. 25, 1996

[30] Foreign Application Priority Data

Apr. 28, 1995 [EP] European Pat. Off. ............ 95830172

[51] Int. Cl.⁶ .................................. G11C 7/00; G11C 7/02
[52] U.S. Cl. .................... 365/190; 365/202; 365/207; 365/208; 327/51
[58] Field of Search ................... 365/189.11, 202, 365/205, 207, 208, 190; 327/51

[56] References Cited

U.S. PATENT DOCUMENTS

| | | | |
|---|---|---|---|
| 3,678,473 | 7/1972 | Wahlstrom | 327/51 |
| 3,774,176 | 11/1973 | Stein et al. | 327/51 |
| 4,216,395 | 8/1980 | Beecham et al. | 327/51 |
| 4,247,791 | 1/1981 | Rovell | 365/190 |
| 4,253,163 | 2/1981 | Komoriya et al. | 365/205 |
| 4,379,345 | 4/1983 | Url | 365/205 |
| 4,498,154 | 2/1985 | Hoffmann | 365/207 |
| 4,796,227 | 1/1989 | Lyon et al. | 365/190 |
| 4,843,264 | 6/1989 | Galbraith | 327/51 |
| 4,951,252 | 8/1990 | White et al. | 365/189.11 |
| 5,012,450 | 4/1991 | Mattausch et al. | 365/189.11 |
| 5,119,335 | 6/1992 | Nozaki | 365/189.11 |
| 5,245,223 | 9/1993 | Lim et al. | 327/51 |
| 5,253,137 | 10/1993 | Seevinck | 327/51 |
| 5,289,420 | 2/1994 | Neu | 365/207 |
| 5,453,956 | 9/1995 | Iwase et al. | 365/189.09 |
| 5,477,497 | 12/1995 | Park et al. | 365/205 |
| 5,504,443 | 4/1996 | Gross et al. | 365/207 |

FOREIGN PATENT DOCUMENTS

A-0 400 725  12/1990  European Pat. Off. .......... G11C 7/06

OTHER PUBLICATIONS

European Search Report from European Patent Application 95830172.3, filed Apr. 28, 1995.

Electronics Letters, vol. 28, No. 9, Apr. 1992, Enage GB, pp. 871–873, Chee et al.; "High Speed Hybrid Current Mode Sense Amplifier for CMOS RAM".

*Primary Examiner*—David C. Nelms
*Assistant Examiner*—Trong Quang Phan
*Attorney, Agent, or Firm*—Wolf, Greenfield & Sacks, P.C.; James H. Morris; Brett N. Dorny

[57] ABSTRACT

A device for reading memory cells, wherein the device contains two branches, wherein each branch comprises, connected in cascade, an electronic switch, an active element reactively connected to the active element of the other branch, so as to form a voltage amplifier. Each active element is controlled by means of a high impedance circuit element. A microswitch connects the two branches together is inserted between the two active elements.

29 Claims, 5 Drawing Sheets

5,694,363

READING CIRCUIT FOR MEMORY CELL DEVICES HAVING A LOW SUPPLY VOLTAGE

BACKGROUND OF THE INVENTION

1. Field of the Invention

The present invention relates to circuits included in memory cell devices and incorporated therein, and in particular a circuit for the reading of such cells.

2. Discussion of the Related Art

The progressive increase in processing and computing power required by the market, and provided by computers and peripheral manufacturers has inevitably required greater speed of access to data stored in both volatile and non-volatile memories. Alongside this requirement, there is also the need to reduce supply voltages in order to limit power consumption.

A highly topical problem is therefore the provision of circuitry which is capable of accessing information in memory in shorter times and with an energy consumption which satisfies market requirements.

The known art also distinguishes between problems relating to the reading of memories with differential cells and those relating to the reading of memories which use reference cells.

By differential cell, we typically mean a circuit of the bistable type, or a pair of floating gate MOS transistors.

The characteristic of differential cells is that they store data in its "direct" and "complemented" form. In the case of a bistable circuit, this is achieved directly as it has two complementary outputs, while in the case of the two transistors, these have to be programmed in a complementary way.

A memory device having differential cells generally comprises a matrix of memory cells which are connected through suitable decoding to preloading blocks by means of so-called bit lines (these are lines connected to the memory cells which form part of a single column). A bit line has a high capacitance associated with it, mainly to the cells connected to it. Before proceeding to read the bits, which is also described in the literature as "sensing", the bit line has to be preloaded, bringing it to a voltage value which makes it possible to perform the reading correctly. This is achieved by means of preloading blocks.

After the bit line has been preloaded, proper reading takes place. The operation is carried out by the "sensing" block which receives a voltage or current signal at its inputs (in1 and in2), then provides an output signal which is sent to an amplifier block or a memory element.

Of course, suitable decoding and addressing circuits are required in order to select the memory cell on which the reading operation is to be carried out.

The greatest limitation on the speed of reading a multi-megabit memory lies within the very structure of the reading devices themselves. All the cells belonging to the same column in fact have a common drain, and therefore the corresponding coupling capacitances between these regions and the substrate add together at the same node, giving rise to capacitive coupling which gets greater as bit lines get longer.

The problem of high speed sensing is tackled in various ways. There are fundamentally two types of sensing: voltage sensing and current sensing. The first uses a voltage, normally generated by a load connected to the bit line, as the input variable. In this first case, the sensing function amplifies the voltage difference which evolves between the direct bit line and the complementary bit line using a voltage amplifier in order to provide a voltage value as an output, which is sufficient to control an output buffer. Current sensing, on the other hand, attempts to detect the value of data included in the memory cell addressed on the basis of whether or not current passes along the bit line. In this case amplification is necessary, and this is achieved by means of a current amplifier, while a second stage of amplification has the task of converting the amplified current into a voltage.

A particularly useful known technique for reading cells of the differential type is that described in the article "Current-Mode Techniques for high-speed VLSI circuit with application to current sense amplifier for CMOS SRAMs" by E. Seevinck, P. J. Van Beers and H. Ontrop, published in the IEEE Journal of Solid State Circuits, vol. 24, no. 4, in Apr. 1991.

In the proposed reading circuit illustrated in FIG. 1, the proposed approach is that of current sensing. During the sensing operation, the cell block (in this case consisting of a differential cell of static RAM) draws current from one or another of its terminals connected to the bit line (D or its complemented counterpart), depending on the value of data stored in the cell block. This uptake of current causes a change (fall) in the current in one of the two transistors T1 and T2 (specifically, the one connected to the terminal from which the current was drawn). This change can be regarded for all purposes as a current signal. The two transistors T1 and T2, which constitute the core of the amplifier, together form a feedback loop. As a result of this loop, a decrease in current in the left (or right) branch corresponds to an increase in the opposite branch, which in turn produces a further reduction in the first, and so on.

The pair of n channel transistors connected to "diode-connected" transistors A1–A2 ensures that the bit line capacitances are preloaded, while the pair N1–N2 has the task of convening the current amplified within the circuit into a voltage. The output voltage signal is sampled at nodes out 1 and out2.

The success of the circuit in FIG. 1 is based on a certain amount of insensitivity to the capacitance of the bit line (this is obtained by keeping the bit line loaded at the optimum operating voltage through two load transistors A1–A2 and the low impedance guaranteed by the said pair), but is however made inefficient on account of two defects which are not negligible. In the first place, the existence of four transistors in series in each branch (A1, T1, S1, N1 and A2, T2, S2, N3) restricts the functional dynamic of the amplifier, so as to require a high supply voltage. In the second place, the insensitivity to the bit line capacitance is only sufficient for a limited range of values, beyond which the circuit experiences speed limitations. The value of the impedance of the two load transistors A1 and A2 cannot in fact be very low, for reasons of both area occupied and power dissipation.

The problems of reading based on the reference cell technique will now be described. Reading reference cells uses a non-volatile memory cell which is identical to the memory cell selected by the decoding blocks. While the selected cell may be written or not (or have a high or low threshold), the reference cell will always be canceled (low threshold). In this way the reading circuit will compare a low threshold cell (which will therefore draw a rated current typical of its physical characteristics) with a cell which might have a low or high threshold depending on the way it has been previously programmed. Obviously the selected cell will draw substantially the same current as the reference cell if the threshold is low, and zero current if the threshold is high.

In the output stages, a reading circuit should provide a high or low logic value depending upon whether the selected cell is the same as or different from the reference cell, from the point of view of the threshold.

A generic reading system using a reference cell is illustrated in FIG. 2. FIG. 2 illustrates a sensing circuit used for reading a value of a selected memory cell. The sensing circuit contains inputs in1 and in2 and outputs out1 and out2. The outputs out1 and out2 couple to a latch. Two decoders connect memory cells attached to a set of word lines to the sensing circuit. Bit lines, which interconnect to the word lines at the memory cells and the decoder on the right in FIG. 2, form a memory matrix with the word lines and allow selected memory cells to be electrically connected directly to the sensing circuit for reading. The left decoder allows a reference bit line to electrically connect directly to a reference memory cell to the sensing circuit as well. During reading, the decoders are set to allow a reference memory cell and a selected memory cell to be selected from a common word line 15. The basic concept of the technique is to compare the generic cell selected (which may have a high or low threshold) with the reference cell which is always virgin, and will therefore always absorb the rated current characteristic for it.

The reason why reading is carried out by a comparison between a selected cell and a reference cell is to make use of an always virgin cell which matches the process variations in the cells of the matrix of which the integrated circuit is fabricated.

Reading using the reference cell technique is not in fact performed by comparing any cell with a single reference cell, rather it compares the bit line which contains the cell which is to be read with the reference bit line. After decoding, we will have selected two cells on the same line of the matrix: the cell which is to be read and the reference cell. Even if the comparison is made with a single reference cell it is correct to speak of the reference bit line.

The reference bit line technique runs into problems through process variation. Given that the memory matrix in fact occupies quite an extensive surface area, the risk of variations in physical and electrical parameters between different cells due to process tolerances is very high, and it is for this reason that the reference bit line route is chosen. Once the word line has been selected, the cell in the reference bit line and the selected cell in the memory are taken into consideration so that the two cells are allocated to the same axis.

The advantage of reading using the technique which makes use of a reference cell, in comparison with reading a differential cell (where the value of data is stored in two memory cells in its direct and complemented form), is essentially that it occupies a smaller area of silicon.

As mentioned earlier in connection with bit lines, in large memory devices (4 Mbit, 16 Mbit) in particular, the drains of various thousands of cells are joined together. The junction capacitances associated with the drains of these cells add together, with the result that overall, they reach several picofarads of capacitive load. Here again it is obvious that the high capacitance of the bit line limits the sensing speed of any system of reading which is based on the amplification of a voltage signal evolved in the drain from the selected cell (voltage-mode operation).

The alternative of current sensing is therefore preferable. The circuitry designed to identify the value of data (the sense amplifier) should have a low input impedance and respond to current rather that voltage signals. The advantage of this method is based essentially on the low input impedance which makes it possible to pass the current from the cell into the sense amplifier without the voltage in the bit line undergoing any appreciable variation. The current method, in other words, makes it possible to assign the bit-line capacitance to a node which substantially has no (or little) effect on the speed with which the data in memory is sensed. Usually a "preloading" operation is also performed in this situation, before proper reading, in order to achieve the optimum voltage on the bit line for performing reading from the node.

When a cell having the same threshold voltage as the reference cell is read, reading is privileged and more difficult. When the cell selected has a high threshold voltage (and therefore zero current passes) comparison with the reference cell is easier. Comparison between two cells having a low threshold on the other hand is more problematical. The current which flows in the two cells is in fact the same, and the task of the sensing circuitry is to detect this state of affairs.

Numerous circuits for reading memory cells based on the reference cell technique are known in the literature, but their use is associated with a supply voltage whose value always tends to decrease in current applications, as mentioned.

In patent application no. 94830415.9 by the same applicant, filed on 31 Aug. 1994, there is a description of a reading circuit for a memory with differential cells which can also be used, with suitably dimensioned components, for reading memory using the reference cell technique, and which has a high data reading speed and the capacity of operating with low supply voltages in both applications.

Where reference cells are read using this circuit it is also possible to improve decision making when reading cells with low current uptakes.

SUMMARY OF THE INVENTION

An object of the present invention is to provide a new circuit for reading memories with differential cells which can also be used to read memories with reference cells, which have a higher data reading speed than known reading circuits, and which can also operate at lower supply voltages.

This and other objects are achieved by a reading circuit which may be used to read differential type memory cells, or a single selected memory cell compared to a reference memory cell. The circuit uses current flow sensing to determine the logic value in a selected memory cell by connecting the selected memory cell to a sensing circuit which include two branches. First, the reference cell is set to a predefined low voltage. Then, the branches are preloaded with a predefined voltage before reading takes place and the voltage on each branch is equalized with the other branch by temporarily connecting the branches together with a microswitch. One branch is connected to the selected memory cell, and the other branch is connected to a reference cell (or the complemented output if reading a differential cell). Each branch extends from the drain of a MOS transistor and is connected to the gate of a MOS transistor of the other branch so as to form a feedback circuit. Thus, when the current flows from the selected memory and reference memory cell, depending upon the value of the cell, one of the MOS transistors is shut off before the other. In this way, current can be sensed on one of the branches, depending upon the value of the selected memory cell. If the selected memory cell is set to a high logic value, then current on the reference cell branch will be inhibited due to the fact that the selected cell branch will shut off the MOS transistor for the reference branch.

In the case of the selected cell being set to low, as is the reference cell, both branches flow briefly, but then the MOS transistor connected to the selected memory cell, which has a slightly greater throughput of current, will shut down the transistor for the reference cell branch first, and inhibit flow in that branch. Thus, current can be sensed and the selected cell will be determined to have contained a low logic value.

BRIEF DESCRIPTION OF THE DRAWINGS

The features and advantages of a reading circuit according to the present invention will be apparent from the description below of an embodiment given by way of a non-restrictive example with reference to the appended drawings, in which:.

DETAILED DESCRIPTION

Figure 1:
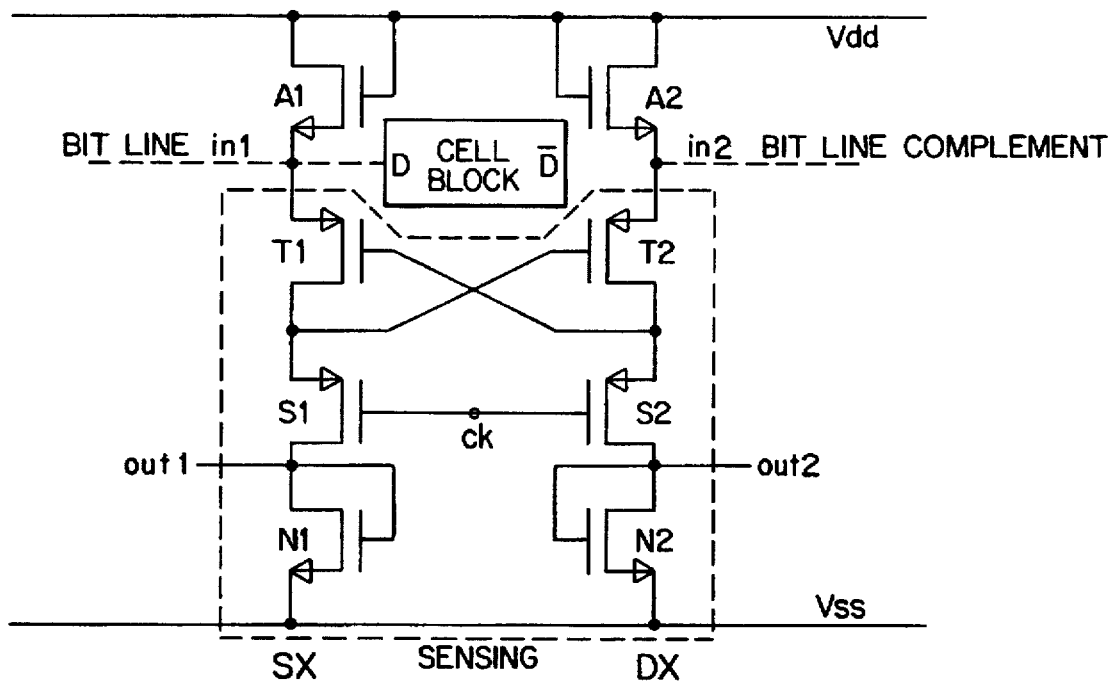
FIG. 1 shows a known current amplification circuit for the reading of differential memory cells.
Figure 2:
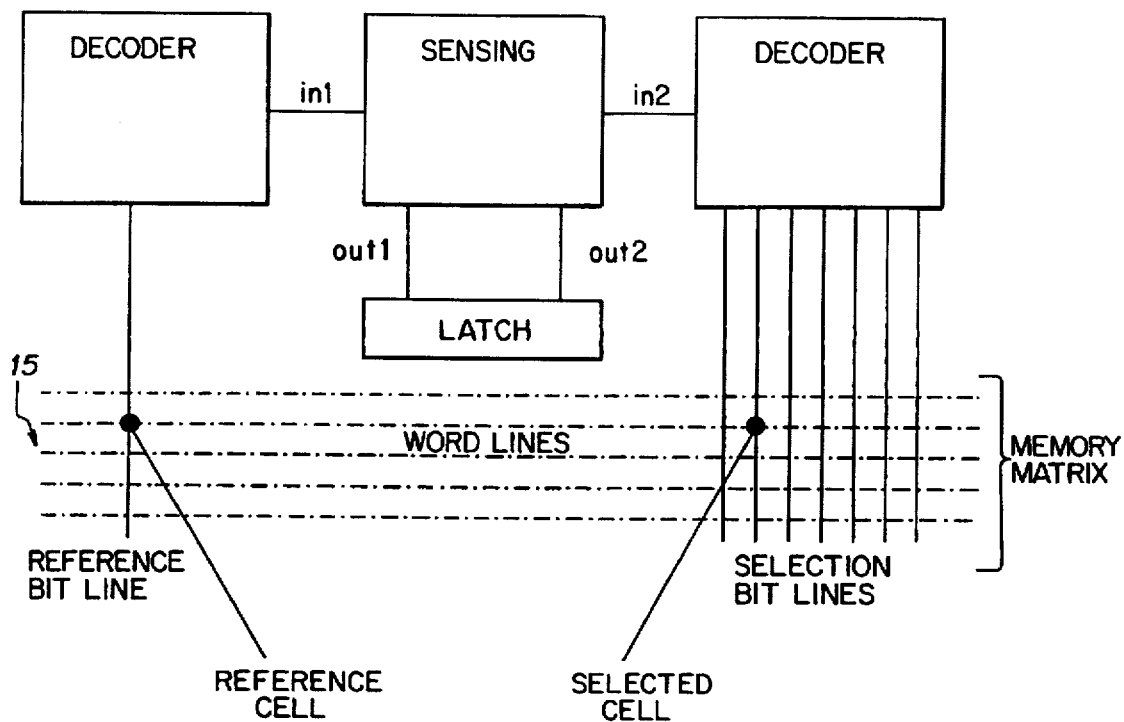
FIG. 2 shows a block diagram of parts of the circuit for reading a memory using the reference cell technique.
Figure 3:
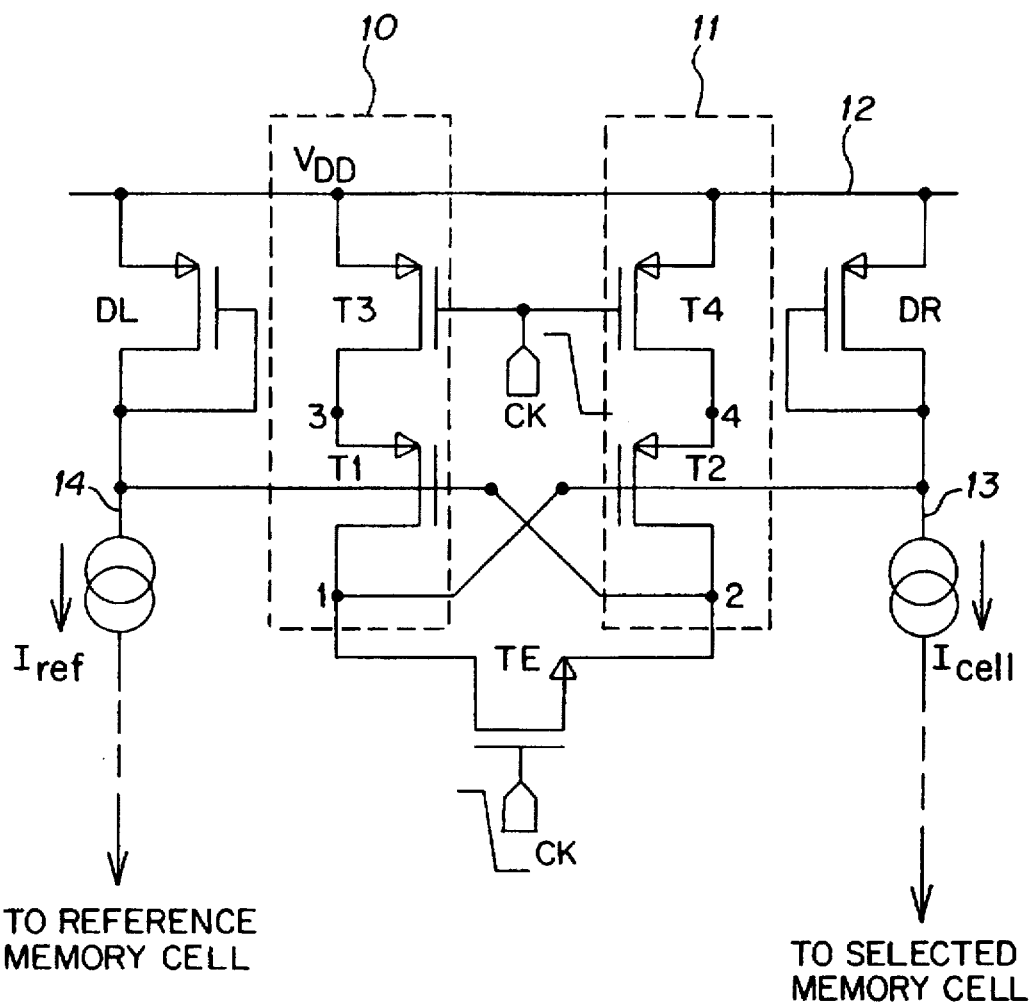
FIG. 3 shows a circuit according to the invention for reading memory cells.

A circuit for reading memory cells according to the present invention, is shown in FIG. 3. The circuit essentially comprises a structure of the differential type having two branches, 10 and 11, connected to one supply line VDD and each comprising, in a cascade arrangement, an electronic switch and an active element connected in a feedback loop to the active element of the other branch, forming a voltage amplifier.

The electronic switches consist of transistors of the MOS type T3 and T4, while the active elements are two transistors of the MOS type, T1 and T2.

A feature of the invention is that the reading circuit includes an equalizing microswitch, TE, inserted between the two branches and connected to two nodes, 1 and 2, in the feedback loop.

Figure 5:
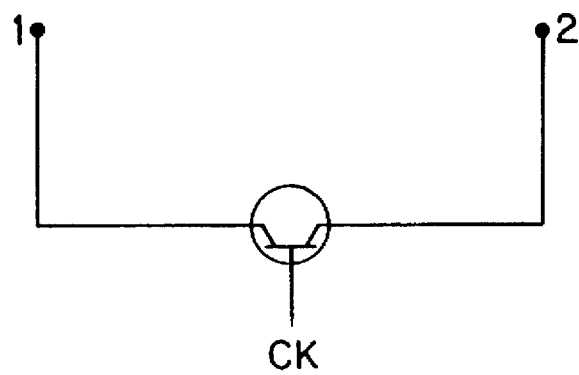
FIG. 5 shows a bipolar transistor used for an equalizing function.
Figure 6:
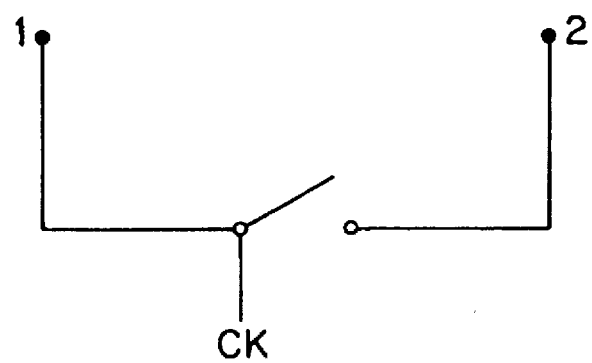
FIG. 6 shows a microswitch used for an equalizing function.

In the figure, this microswitch, which is controlled synchronously with switches T3 and T4, is provided by means of an N channel MOS transistor. This equalizing function could also be obtained using a bipolar transistor (shown in FIG. 5) or a microswitch (shown in FIG. 6) of the "elastic silicon sheet" type known to those skilled in the art and obtained by chemical etching beneath a metallized portion of the integrated circuit's substrate.

Active elements T1 and T2 are controlled by means of high impedance circuit elements, DL and DR, inserted between the supply line 12, and the reference bit line 14 and the selection bit line 13 for reading, respectively.

The embodiment which has been discussed relates in particular to the method of reading using reference cells, but what has been disclosed is also valid for the differential cell method.

In the preloading stage, sensing nodes 1 and 2 are also preloaded and pre-equalized. Two transistors DL and DR are provided for the purpose. By acting on their W/L aspect ratios it is possible to adjust the end-of-preloading voltage of the two nodes to a value of approximately VDD/2. This operation makes it possible to place the sense amplifier under optimum conditions for comparison.

In order for the amplification system to be activated, the signal CK must have a low logic level. This way, the two transistors T3 and T4 exit the inhibiting condition which made it possible to keep the amplifier inactive when it was not used. Thus a current flows within T3 and T4, which, since T1 and T2 are still inactive (nodes 1 and 2 were in fact raised to the same potential during the previous preloading stage), tends to load the nodes 3 and 4 corresponding to their drain. This loading has the effect that T1 and T2 can become active, thus determining the evolution of the circuit through initiating the positive feedback, brought about by the cross connection between the two transistors. At the same time, the same signal CK, controlling the gate of the equalizing transistor placed between the two output nodes 1 and 2, deactivates this device and therefore makes the circuit free to evolve, from a situation of initial instability into one of the stable output conditions, depending on the control signal.

Let us consider the reading of a "1" (a cell programmed with a high threshold).

For the moment we will restrict ourselves to an intuitive analysis of the operation of the system. The presence of any offsets and/or dimensional imbalances in the structure will not therefore be considered.

Assuming that when preloading is complete the input/output nodes (1 and 2) are at a common equalizing voltage (approximately 1.6 V), when the voltage time signal CK has a low logic level the inhibiting transistors T3 and T4 become conducting, enabling the voltage to rise in nodes 3 and 4. The change over the course of time in these two latter nodes can be regarded as being uncorrelated with that in 1 and 2. This latter consideration is true provided that the loading time constant for the drains of T3 and T4 is less than the time constant for the change in the output nodes (1 and 2) themselves. This assumption can easily be satisfied in that nodes 3 and 4 are not particularly "heavy" from the capacitance point of view (they are certainly "lighter" than nodes 1 and 2), and in addition to this, the control circuit for signal CK has no slew-rate problems in discharging the gates of the two inhibiting transistors T3 and T4.

Turning now to the evolution of the circuit, it will be noted that in this case, the lack of current in the branch with the selected cell rules out the only path available for a stationary current through T1, and as a consequence the drain of T1 (node 1) has no other possibility than to charge up to a high voltage level (VDD). The rise in voltage at node 1 simultaneously causes a progressive reduction in the control voltage of T2, which ceases to be active when the latter falls below the conducting threshold. As a consequence of the lack of supply for the charging from T2, node 2 tends to discharge through the reference cell, which, when it is selected is always capable of taking up a current having a predetermined value iref (for example approximately 30 ma). Discharging continues until a condition of balance occurs between the current iref (i.e. the current taken up by the reference cell) and that in transistor DL, so that they stabilize. It will be noted that the fall in voltage at node 2 results in an increase in the control voltage of T1, which is o thus in a position to provide more current to node 1, which in turn will rise more quickly. This positive feedback effect causes a relatively rapid change in the circuit, which quickly results in the establishment of an appreciable difference between the potentials of nodes 1 and 2 (splitting).

We will now consider the reading of a "0" (the non-programmed cell).

Since it is necessary to compare two memory cells (reference and selection cells) in which the same current flows under these conditions, or in which there are two substantially identical bit line currents in bit lines 13–14 (where $I_{cell}$ is the current of the memory cell being read), a suitable discrimination mechanism is required in the circuit. In fact, in this case there is the possibility of conduction through both T1 and T2, but current should only flow through one of the two when the reading transient has decayed, leaving the other disabled. More specifically, in order to distinguish this situation from that of the reading of a "1", T2 should conduct while T1 should inhibit, so that node 2 is at a higher voltage than node 1.

Correct behavior of the circuit is obtained by suitable dimensioning of T1 with respect to T2 (more specifically the aspect ratio W/L of T1 is selected to be lower than that of T2). For equal initial biasing conditions, therefore, T2 can conduct more current. As a consequence of this, node 2 will tend to charge up more quickly than node 1, starting a feedback phenomenon at the gate of T1, which, with a fall in its control voltage, will cause a reduction in the current in the left branch of the amplifier. The effects are as follows:

node 1 reverses its initial tendency to charge up, given that the current contribution from T1 is less, transistor T2 receives an increased control voltage, as a result of the fall in the voltage at its gate, and can therefore conduct a larger current.

Obviously the positive feedback phenomenon just described causes a rapid change in the circuit, causing node 2 to reach a high voltage level, and causes a discharge of node 1 to a lower equilibrium value (iDR=icell).

It is quite important to note that in a reading circuit according to the present invention, there is an intrinsic mechanism for recovering the offset.

It is of particular advantage to see how the proposed circuit in fact makes it possible to compensate for the initial voltage at the reading nodes, thus allowing any imperfect equalization in the branches of the amplifier and/or any offset to be corrected. The operation is made possible through a suitable imbalance in the capacitive loads present in the nodes themselves.

Figure 4:
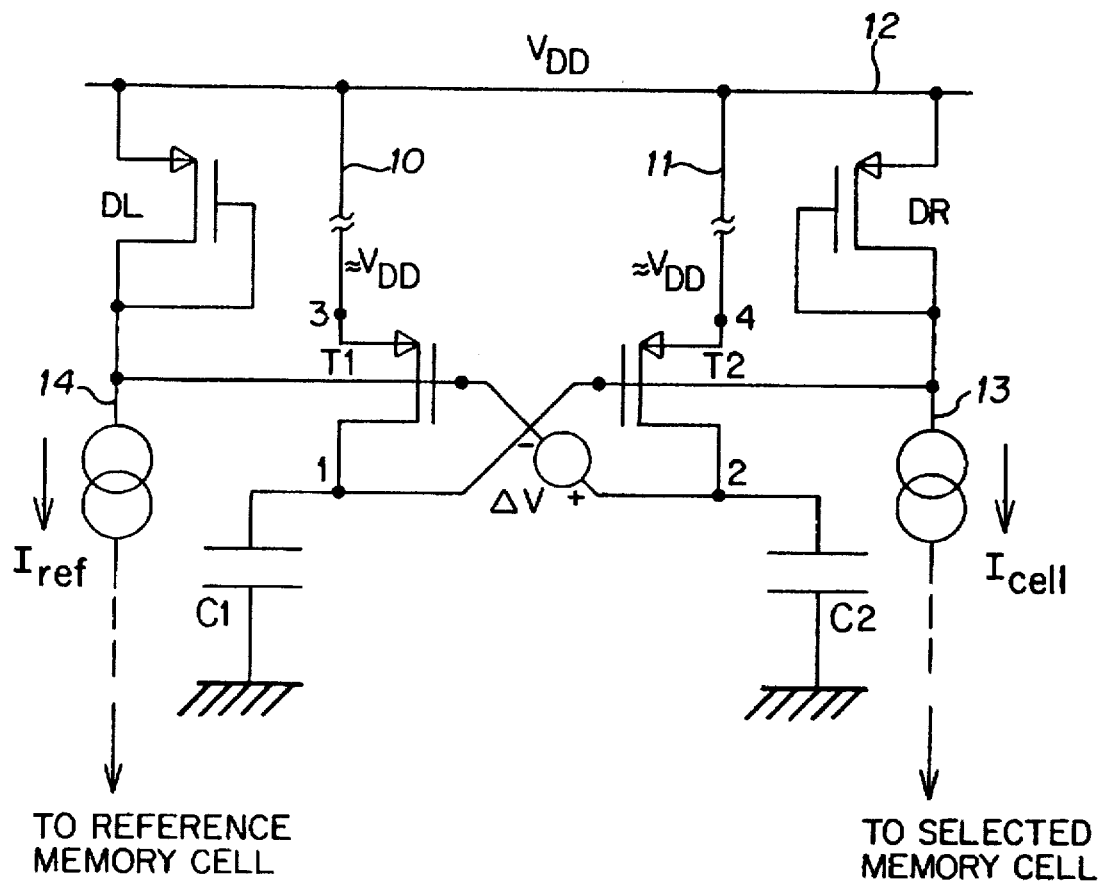
FIG. 4 shows an equivalent diagram for the circuit according to the present invention.

Let us consider the situation shown in FIG. 4 (to which reference will be made), which shows the circuit at the end of the preloading stage. It is assumed in this analysis that a low o threshold cell is to be read, which as will be seen is the worst case from this point of view. In order that the two transistors T1 and T2 can conduct, their control voltages must be greater than the corresponding threshold voltages. Considering T1 for example, the difference between its source voltage (corresponding to node 3) and its gate voltage (corresponding to node 2) must be greater than the absolute value of its threshold voltage VTH 1. This threshold voltage can be regarded as the sum of two contributions: the rated threshold voltage for the device (VTHp) plus a term for the difference ΔV with respect to the latter, equivalent to a voltage offset due to process tolerances. This offset can include effects due to various types of mismatch between T1 and T2, and in general between two branches of the circuit in FIG. 3. The control voltage for T1, which when preloading is complete is less than the modulus of VTH1, undergoes a change which causes it to increase.

Specifically, the source of T1 rises towards VDD through the load provided by T3, but before a conducting channel can be created in T2 the gate of T1 tends to discharge across the reference cell, as DL is not able to provide all the current to the virgin reference cell addressed. At the same time, the voltage in node 1 also tends to discharge, in this case through the selected cell, while node 4 increases towards VDD.

If the capacitance at node 2 is indicated by C2, the discharge time constant will be approximately equal to the product of this and RB, were RB indicates the parallel of the resistances seen from the drain of DL and the reference bit line. Approximately then $$R_B \cong \frac{1}{g_{mDL}} // R_{bit-line-rif}$$

A structure having a high output resistance, such as e.g. a cascode structure, can be used in a known way in the circuit for decoupling and adjusting the bit-line voltage. It is obvious that in this way, the resistance of the bit line will be much greater than that shown by the drain of DL, and therefore RB can be approximated to:

$$R_B \cong \frac{1}{g_{mDL}}$$

The same thing happens with T2, which in general will have VTH2≠VTH1 (without losing any generality, it may be assumed that the threshold of T2 is equal to the rated threshold, incorporating all the effects of mismatches in that of T1) and will have a different capacitive load at its gate. Capacitance C2 is intrinsically greater than C1, in the situation in which T1 and T2 are disabled, in that the diffusion regions of T2 are larger than those of T1. In any event, it is possible to change the capacitance value by inserting a suitable capacitive load in node 2 which acts as a ballast. The discharge time constant for node 1, until T1 is deactivated, is C1×RB, given that the impedances of the two branches of the bit line (which are symmetrical to each other) can be assumed to be nominally equal, and DL and DR are nominally identical.

Thus while the two nodes 1 and 2 are discharging, a differential voltage can be set up between them which is determined by the different time constants mentioned above. In particular, by a suitable choice of the imbalance factor (DC=C2−C1), it is possible to arrive at a situation such that, between the time T0 in which CK decreases and the instant tON in which one of the two transistors becomes active, the slower discharge at node 2 makes it possible to compensate for the offset ΔV, thus favoring the activation of T2 before T1. The condition for correct sensing is effectuated in this way (it will be noted that if the time constants of nodes 1 and 2 were equal, transistor T1 would become active first, and this would as a result of the positive feedback loop cause a change in the sensing circuit in the opposite direction to the correct one. Node 1 would change to a higher voltage while node 2 would change to a low voltage level).

It should be pointed out that the capacitive compensation technique described above is effective because in this case the issue is the correction of any offset in one direction only (reading the cell with a low threshold): in particular, the cancellation of a possible positive voltage ΔV, between the gate of T1 and node 2. In the other reading situation, any equivalent voltage offset present in the pair T1–T2 could at most cause a slowing of the change in the circuit, but the sensing would in any event be correct as stated above. In fact, the lack of current in the branch of the selected cell would, in any event, cause a change in the amplifier in the correct direction. Also, this offset would be already compensated for during the preloading stage. The presence of the non-ideal equalizing transistor (TE) would, in this case, make it possible to obtain a positive differential voltage between node 1 and node 2 once preloading was complete, as only the reference cell would then be in a position to draw current and transistor DL would therefore experience a greater fall than its counterpart DR.

Similar considerations to those given for the reading of a "1" (including the problems relating to the offset) may be raised when the circuit is applied to the case of reading differential cells. In fact, in this case, when reading both "1" and "0", only one branch; the cell or complemented cell, is capable of taking up current.

The resistance loads present in the comparison structures of conventional latches are not present at nodes 1 and 2 in the circuit. Because of this, the two sensing control transistors, T1 and T2, are only able to conduct a static current through the bit line.

In this way, it is possible to make the currents from the selected cells effectively flow in the branches of the sense amplifier. This behavior makes it possible for the circuit to function correctly even with a fairly low supply voltage (e.g. VDD=2.5 V). The reduction in the supply voltage, which causes the memory cells to conduct a lesser current than that corresponding to the rated conditions (3V supply), causes a scaling of the internal currents in the sense amplifier, but does not substantially alter its behavior. In other words, the system proposed allows the maximum possibility for voltage swing at the two output nodes 1 and 2 under all sensing conditions. This does not happen with the conventional voltage approach, which is highly susceptible to variations in the supply conditions.

It is also possible to achieve passive compensation of the equivalent offset present at the sensing nodes, by inserting a dummy capacitance at node 2.

The capacitive load of the node thus controls both the offset compensation effect and the sensing speed, or the speed of splitting the outputs. In this way, an ideal compromise can be obtained between working speed and reading reliability. For example, it is possible to achieve cancellation of the equivalent offset and/or pre-equalization error at the sensing nodes for values up to 60–70 mV, while retaining high sensing speeds.

In conclusion, a reading circuit according to the present invention makes it possible to control the function of the circuit in unfavorable reading situations (worst case), in particular when an equivalent offset is present at the sensing nodes. The system therefore makes it possible to achieve a balance between working speed and reading reliability through capacitive compensation of the offset. It is also possible to obtain a correct reading even if the supply voltage is reduced to 2.5V (a typical effect which is found when the supply source consists of a battery, for example).

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A reading circuit with a differential structure for reading memory cells comprising:
   two branches connected to a reference potential, wherein each branch includes components connected together in a cascade arrangement, wherein the components include an electronic switch and an active element which is connected in a feedback loop to the active element of the other branch, so as to form a voltage amplifier therewith;
   wherein the two branches are connected together by means of a microswitch which is inserted between the two active elements; and
   wherein a control terminal of the active element of one branch is electrically connected to a selection bit line of memory cell as to create a current path to said memory cell and a control terminal of the active element of another branch is electrically connected to a reference bit line of a memory cell so as to create a current path to said memory cell.

2. The reading circuit according to claim 1, wherein the electronic switches and the microswitch operate synchronously via a clock signal.

3. The reading circuit according to claim 2, wherein the electronic switches, the active elements, and the microswitch are transistors of the MOS type.

4. The reading circuit according to claim 1, wherein the active elements are operated by means of high impedance circuit elements, one of which is inserted between the reference potential and the selection bit line of a memory cell, and another is inserted between the reference potential and the reference bit line of a memory cell.

5. The reading circuit according to claim 4, wherein the high impedance circuit elements are diode-connected transistors.

6. A memory device comprising:
   first and second bit lines; and
   a reading circuit, wherein said reading circuit includes a differential structure comprising two branches connected to a reference potential, wherein each branch includes components connected together in a cascade arrangement, wherein the components include an electronic switch and an active element which is connected in a feedback loop to the active element of the other branch, so as to form a voltage amplifier therewith, and wherein the two branches are connected together by means of a microswitch which is inserted between the two active elements, and a control terminal of an active element of one of said two branches electrically connects to the first bit line, and a control terminal of an active element of another of said two branches electrically connects to the second bit line.

7. The memory device according to claim 6, further comprising:
   a memory cell having an output connected to said first bit line;
   a reference cell having an output connected to said second bit line.

8. The memory device according to claim 6, further comprising
   at least one memory cell of differential type having a first output for a logic value in its direct form, said first output connected to said first bit line, and having a second output for said logic value in its complemented form, said second output connected to said second bit line.

9. A memory device according to claim 6, wherein:
   the active elements are operated by means of high impedance circuit elements, one of which is inserted between the reference potential and said first bit line, and another is inserted between the reference potential and said second bit line.

10. The memory device according to claim 9, further comprising:

a memory cell having an output connected to said first bit line; and a reference cell having an output connected to said second bit line.

11. The memory device according to claim 9, further comprising at least one memory cell of differential type having a first output for a logic value in its direct form, said first output connected to said first bit line, and having a second output for said logic value in its complemented form, said second output connected to said second bit line.

12. A method of sensing a logic value stored in a selected memory cell, using a current sensing circuit containing first and second sensing branches, wherein a control terminal of an active element of the first sensing branch is electrically connected to a reference memory cell and the a control terminal of an active element of the second sensing branch is electrically connected to said selected memory cell, comprising the steps of:

loading said reference memory cell with a predetermined logic value;

pre-loading said first and second sensing branches with a predetermined potential;

equalizing the potential between said first and second sensing branches within said sensing circuit by temporarily coupling said first and second sensing branches;

providing current to said current sensing circuit;

sensing current flow within said first and second sensing branches, wherein said current flows reflect a relationship between the predetermined logic value stored in said reference memory cell and a logic value stored in said selected memory cell.

13. The method according to claim 12, wherein:

said loading step includes a step of setting the reference memory cell to a low logic value; and wherein when said selected memory cell contains a low logic value, said sensing step includes the steps of:

charging the first sensing branch electrically connected to said reference memory cell to a high voltage level;

allowing conduction to the first sensing branch electrically connected to said reference memory cell;

discharging said second sensing branch electrically connected to said selected memory cell to a low voltage level; and inhibiting current flow within said second sensing branch connected to said selected memory cell.

14. The method according to claim 12, wherein:

said loading step includes a step of setting the reference memory cell to a low logic value; and wherein when said selected memory cell contains a high logic value, said sensing step includes the steps of:

charging the second sensing branch electrically connected to said selected memory cell to a high voltage level;

allowing conduction to the second sensing branch electrically connected to said selected memory cell;

discharging said first sensing branch electrically connected to said reference memory cell to a low voltage level;

inhibiting current flow within said first sensing branch connected to said reference memory cell.

15. The method according to claim 12, wherein the pre-loading step includes a step of setting the potential of said first sensing branches to approximately ½ of a reference supply voltage.

16. The method according to claim 12, wherein said equalizing and activating steps are performed synchronously, and wherein said providing step includes connecting said reference supply voltage to said sensing circuit.

17. The method according to claim 12, further comprising the step of selecting said reference memory cell and said selection cell from a common word line within a memory matrix.

18. The method according to claim 12, wherein said reference memory cell and said selected memory cell each occupy one single memory cell respectively and each stores its respective value in its direct form.

19. A circuit for reading a logic value in a memory comprising:

a reference memory cell;

first and second sensing transistors, wherein a gate of said second sensing transistor is electrically connected to a selected memory cell and is also connected to a drain of said first sensing transistor, forming a first sense node; and a gate of said first sensing transistor is electrically connected to said reference memory cell and is also connected to a drain of said second sensing transistor, forming a second sense node;

an activator circuit connected to sources of said first and second sensing transistors;

a preloading circuit connected to said first and second sense nodes;

an equalization circuit connected to between said first and second sense nodes;

a clocking circuit connected to said activator circuit and connected to said equalization circuit.

20. The circuit according to claim 19, wherein:

said activator circuit includes first and second inhibiting transistors each having a source, a gate, and a drain, and each having its gate connected to said clocking circuit, and its source connected to a reference voltage, and said first inhibiting transistors drain connects to the source of said first sensing transistor, and said second inhibiting transistors drain connects transistors drain connects to the source of said second sensing transistor; and said preloading circuit includes first and second high impedance transistors each having a source, a gate, and a drain, and each having its source connected to said reference voltage, and its gate connected to its drain, and wherein said first high impedance transistors gate/drain connection connects to said first sense node and the second high impedance transistors gate/drain connection connects to said second sense node.

21. The circuit according to claim 20, wherein said equalization circuit comprises an N channel MOS transistor having a gate connected to said clocking circuit, and having a source connected to said first sense node, and a drain connected to said second sense node.

22. The circuit according to claim 20, wherein said equalization circuit comprises a bipolar transistor connected between said first and second sense nodes.

23. The circuit according to claim 20, wherein said equalization circuit comprises a microswitch of "elastic silicon sheet" type connected between said first and second sense nodes.

24. The circuit according to claim 19, wherein said second sensing transistor conducts more current than that of said first sensing transistor.

25. The circuit according to claim 19 wherein a W/L (Width/Length) aspect ratio of said first sensing transistor is lower than that of the second sensing transistor.

26. The circuit according to claim 20, wherein said pair of high impedance transistors have W/L (Width/Length) aspect ratios such that drain voltage of said sense nodes is approximately the reference voltage/2.

27. The circuit according to claim 20, wherein said reference memory cell and said selected memory cell are located on a common word line within a memory matrix.

28. The circuit according to claim 20, wherein said reference memory cell and said selected memory cell each occupy one single memory cell respectively and each stores a respective logic value in a direct form.

29. The circuit according to claim 20, wherein said reference memory cell and said selected memory cell are comprised of outputs from a single differential type memory cell.

* * * * *